(12) United States Patent
Mateescu et al.

(10) Patent No.: US 10,379,952 B2
(45) Date of Patent: Aug. 13, 2019

(54) DATA RECOVERY AND REGENERATION USING PARITY CODE

(71) Applicant: Western Digital Technologies, Inc., San Jose, CA (US)

(72) Inventors: Robert Eugeniu Mateescu, San Jose, CA (US); Cyril Guyot, San Jose, CA (US); Lluis Pamies-Juarez, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 95 days.

(21) Appl. No.: 15/626,027

(22) Filed: Jun. 16, 2017

(65) Prior Publication Data

US 2018/0365107 A1 Dec. 20, 2018

(51) Int. Cl.
G06F 11/10 (2006.01)
H03M 13/00 (2006.01)
H03M 13/37 (2006.01)

(52) U.S. Cl.
CPC ....... G06F 11/1088 (2013.01); H03M 13/373 (2013.01); H03M 13/3761 (2013.01); H03M 13/616 (2013.01); H03M 13/6502 (2013.01)

(58) Field of Classification Search
CPC .............. G06F 11/1088; G06F 11/108; G06F 11/1092; H03M 13/616; H03M 13/6502; H03M 13/2927; H03M 13/05; H03M 13/1102; H03M 13/118; H03M 13/2942; H03M 13/1545; H03M 13/29; H03M 13/3761; G11B 20/1426
See application file for complete search history.

(56) References Cited

U.S. PATENT DOCUMENTS

| | | | | |
|---|---|---|---|---|
| 6,760,478 B1 * | 7/2004 | Adiletta | ............... | H04N 19/159 375/240.02 |
| 7,006,698 B2 * | 2/2006 | Adiletta | ............... | H04N 19/159 375/240.02 |

(Continued)

OTHER PUBLICATIONS

Author Unknown "Parity Bit" dated Feb. 19, 2017, retrieved from <https://en.wikipedia.org/w/index.php?title=Parity_bit&oldid=766316873> 6 pages.

*Primary Examiner* — Phung M Chung
(74) *Attorney, Agent, or Firm* — Patent Law Works LLP

(57) ABSTRACT

The disclosed technology can advantageously provide an efficient data recovery system including a plurality of storage nodes including a first storage node and a second storage node, and a storage logic that is coupled to the storage nodes and that manages storage of data on the storage nodes. The storage logic is executable to: receive a data set including data elements including a first set of data elements associated with the first storage node and a second set of data elements associated with the second storage node; generate a first parity of the data set, the first parity including a horizontal parity including a set of horizontal parity entries; and combine the data elements from the data set to produce a skipper parity including a set of skipper parity entries. Combining the data elements includes transforming a subset of the data elements from the data set using an invertible operation, the set of horizontal parity entries being different from the set of skipper parity entries.

20 Claims, 15 Drawing Sheets

(56) References Cited

U.S. PATENT DOCUMENTS

| | | | |
|---|---|---|---|
| 8,645,789 B2* | 2/2014 | Sharon | G06F 11/1012 714/755 |
| 8,880,987 B2* | 11/2014 | Sharon | G06F 11/1012 714/752 |
| 8,972,835 B1* | 3/2015 | Rahul | H03M 13/19 714/800 |
| 9,003,264 B1* | 4/2015 | Prins | G06F 11/10 714/773 |

* cited by examiner

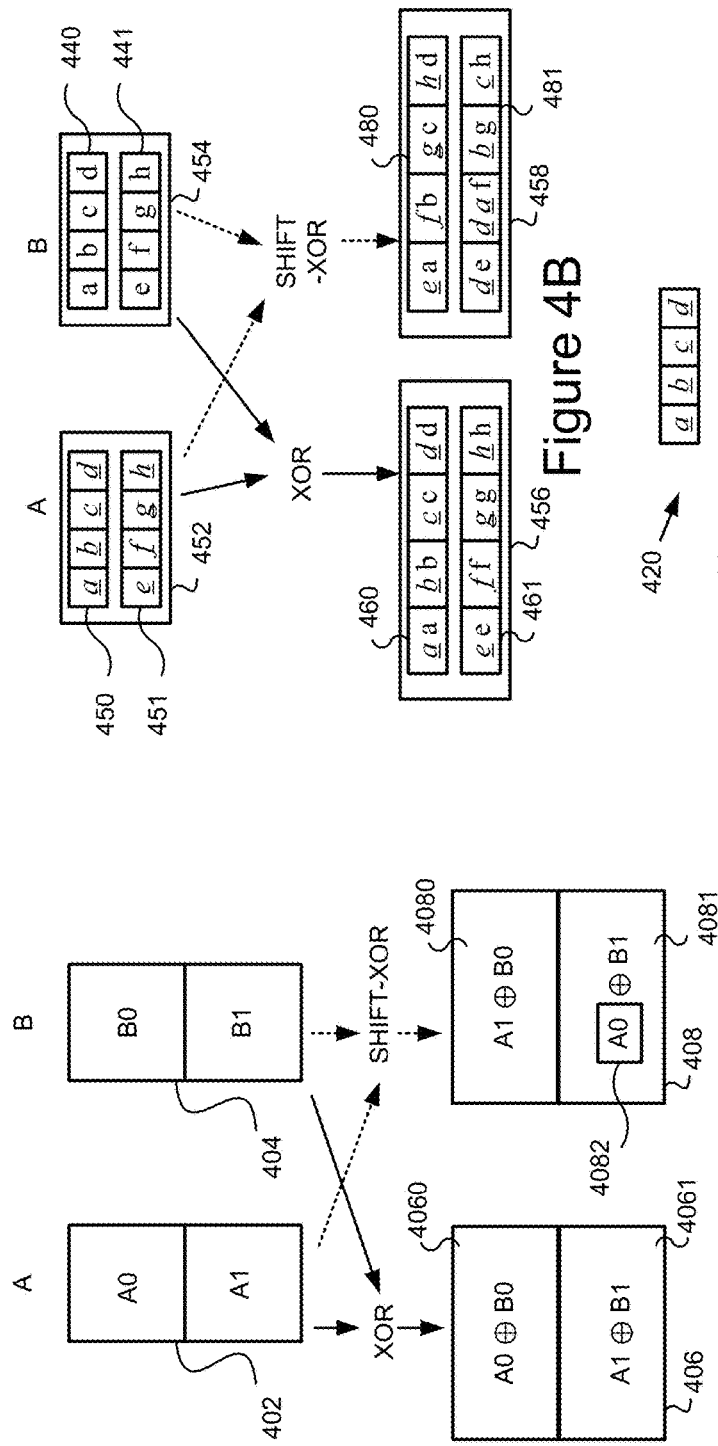

DATA RECOVERY AND REGENERATION USING PARITY CODE

BACKGROUND

The present disclosure relates to data recovery and/or regeneration.

Data can often become corrupted as it is transmitted, processed, and/or stored in memory. Parity bits are often used to verify the integrity of the data to ensure against corruption. Since the amount of data that is being processed and stored has increasingly dramatically over the past several years and is only accelerating, particularly in large storage applications, such as enterprise storage and cloud applications, the amount of parity-checking that is required is rising at a corresponding rate.

Conventional parity-checking algorithms, however, often require increasingly significant computational and storage requirements and are unable to scale at an acceptable rate. The above problem is further exacerbated when performing lost data reconstruction using previously computed parity information, because the requirements for accurately reconstructing the data are cumbersome and computationally expensive using conventional parity reconstruction techniques, particularly in the event of a storage device failure.

As a further example, for in the past decade or so, the term "regenerating code" has at times been used in the coding theory community to describe code constructions that focus on the amount repair traffic (data) that is required to repair one or more failures (1 failure, 2 failures, etc., depending on how many failures are tolerated).

For example, with 10 user nodes of 1 terabytes (TB) each, and 2 parity nodes, of 1 TB each, there are a total of 12 TB. Prior solutions would often use traditional Reed Solomon code for error correction, and would tolerate up to 2 node failures. In case of 1 node failure, the traffic would be 10 TB (9 surviving nodes with user data and 1 parity node), thus providing no traffic savings relative to the size of the original 10 user nodes. In case of 2 failures, the traffic would be the same 10 TB.

SUMMARY

According to one innovative aspect of the subject matter in this disclosure, a system includes a data storage system including a plurality of storage nodes including a first storage node and a second storage node, and a storage logic that is coupled to the storage nodes and that manages storage of data on the storage nodes. The storage logic is executable to: receive a data set including data elements including a first set of data elements associated with the first storage node and a second set of data elements associated with the second storage node; generate a first parity of the data set, the first parity including a horizontal parity including a set of horizontal parity entries; and combine the data elements from the data set to produce a skipper parity including a set of skipper parity entries. Combining the data elements includes transforming a subset of the data elements from the data set using an invertible operation, the set of horizontal parity entries being different from the set of skipper parity entries.

In general, another innovative aspect of the subject matter described in this disclosure may be implemented in methods that include: receiving a data set comprising data elements including a first set of data elements associated with a first storage node and a second set of data elements associated with a second storage node; generating a first parity of the data set, the first parity including a horizontal parity including a set of horizontal parity entries; and combining the data elements from the data set to produce a skipper parity including a set of skipper parity entries, combining the data elements including transforming a subset of the data elements from the data set using an invertible operation, the set of horizontal parity entries being different from the set of skipper parity entries.

Other implementations of one or more of these aspects include corresponding systems, apparatus, and computer programs, and other aspects. These and other aspects may be configured to perform the actions of the methods, encoded on computer storage devices.

These and other implementations may each optionally include one or more of the following features and/or operations: that the invertible operation includes one of a shift operation and a XOR operation; that the storage logic is further executable to receive a request to recreate the first set of data elements of the first storage node from the first parity and the skipper parity; that the first storage node is a failed storage node; that the storage logic is further executable to in response to receiving the request to recreate the first set of data elements, retrieve the second set of data elements, the first parity and the skipper parity, and recreate the first set of data elements based on the second set of data elements, the first parity, and the skipper parity; that the storage logic is further executable to in response to receiving the request to recreate the first set of data elements, determine needed data elements of the second storage node to recreate data for the first set of data elements, the needed data elements comprising a subset of the second set of data elements, determine needed horizontal parity entries of the first parity and the needed skipper parity entries of the skipper parity, and recreate the first set of data elements based on the needed data elements of the second storage node and the determined parity entries; that the needed data elements of the second storage node include at least half and less than all of the second sets of data elements; that to combine the data elements from the data set to produce the skipper parity includes determining locations of certain skipper parity data elements in a skipper parity matrix using a predefined rule; receiving a request to recreate the first set of data elements of the first storage node from the first parity and the skipper parity; in response to receiving the request to recreate the first set of data elements, retrieving the second set of data elements, the first parity and the skipper parity; recreating the first set of data elements based on the second set of data elements, the first parity, and the skipper parity; in response to receiving the request to recreate the first set of data elements, determining needed data elements of the second storage node to recreate data for the first set of data elements, the needed data elements comprising a subset of the second set of data elements; determining needed horizontal parity entries of the first parity and the needed skipper parity entries of the skipper parity; and recreating the first set of data elements based on the needed data elements of the second storage node and the determined parity entries.

These implementations are particularly advantageous in a number of respects. For instance, when there is one failed content store, only half of the remaining data is needed to recreate the data for the failing content store using the first and second parities. Further, the construction of the parity data ensures that when there is an update of one data element in the content, the update to the first and second parities only requires updating one entry for each of the first and second parities.

Further, with respect to the example described in the Background involving 10 user nodes and 2 parity nodes, the skipper code implementations over these same nodes can substantially reduce the amount of repair traffic needed in the case of a single node failure. To illustrate, if 1 user node fails, then all surviving (9 user and 2 parity) nodes may be contacted, and each one sends half of its data, for a total traffic of 11×0.5 TB=5.5 TB (compared to the 10 TB) of the above-described prior solutions. Thus, unlike the prior solutions of the Background, for a single node failure, the skipper code is an optimal regenerating code, which can provide for code construction that requires less (typically the least) amount of traffic.

It should be understood that language used in the present disclosure has been principally selected for readability and instructional purposes, and not to limit the scope of the subject matter disclosed herein.

BRIEF DESCRIPTION OF THE DRAWINGS

The present disclosure is illustrated by way of example, and not by way of limitation in the figures of the accompanying drawings in which like reference numerals are used to refer to similar elements.

FIGS. 4A-4C are diagrams illustrating the generation and utilization of example skipper parities.

DETAILED DESCRIPTION

Technology for implementing a recovery-optimal parity code is described below. While the technology is described in the context of a particular system architecture, it should be understood that the systems and methods can be applied to other architectures and organizations of hardware. Using the recover-optimal parity code, the technology can recover data elements stored in a plurality of storage nodes (also called data content stores, or content stores) more efficiently than prior solutions because less of the available data is needed for the restoration. As such, the technology can advantageously maximize the maximum distance separable (MDS) property, which increases the allowable number of nodes that can fail while still ensuring data integrity.

Figure 1:
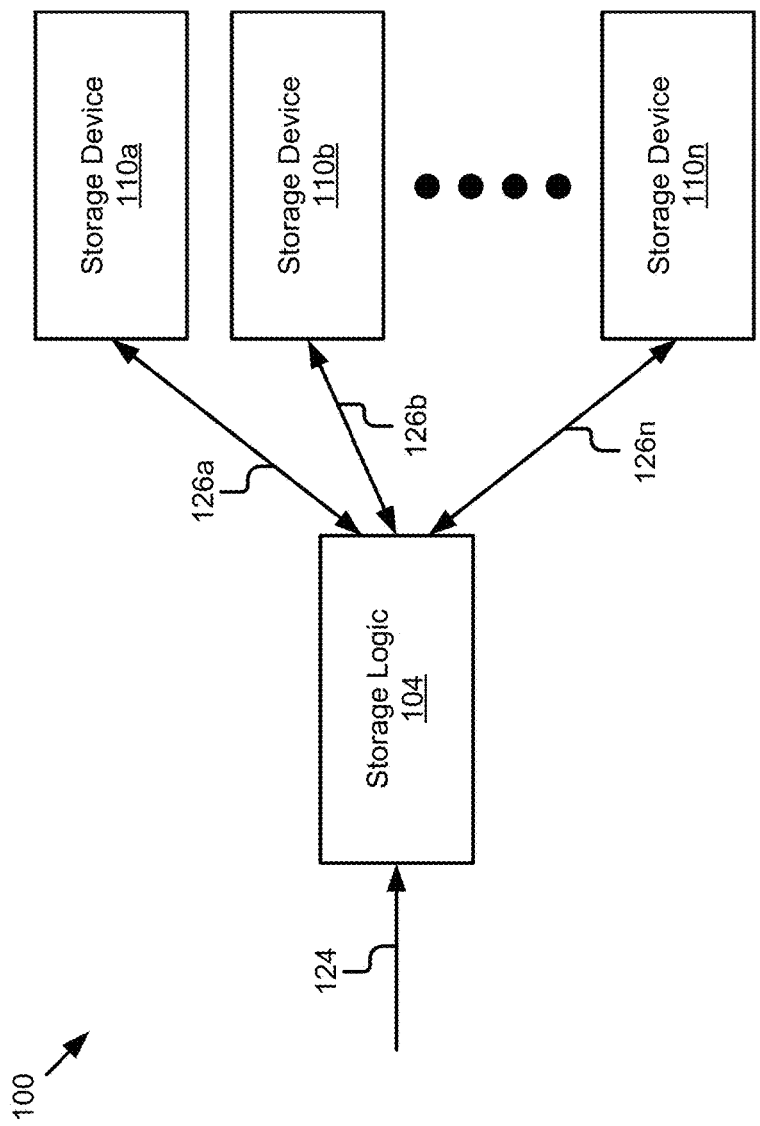
FIG. 1 is a high-level block diagram illustrating an example data recovery system.

FIG. 1 is a high-level block diagram illustrating an example data recovery system 100. In the depicted embodiment, the system 100 may include storage logic 104, and one or more storage devices or physical storage media 110$a$, 110$b$ through 110$n$ (also referred to as storage nodes or content stores). In the illustrated embodiment, the storage logic 104 and the one or more storage devices 110$a$, 110$b$ through 110$n$ are communicatively coupled via signal lines 126$a$, 126$b$ through 126$n$. However, the present disclosure is not limited to this configuration and a variety of different system environments and configurations can be deployed and are within the scope of the present disclosure. Other embodiments may include additional or fewer components. It should be recognized that FIG. 1 as well as the other figures used to illustrate an embodiment, and an indication of a letter after a reference number or numeral, for example, "110$a$" is a specific reference to the element or component that is designated by that particular reference numeral. In the event a reference numeral appears in the text without a letter following it, for example, "110," it should be recognized that such is a general reference to different embodiments of the element or component bearing that general reference numeral.

In some embodiments, the storage logic 104 implements a recovery-optimal parity code as well as store-related operations in storage devices. The storage logic 104 can provide computing functionalities, services, and/or resources to send, receive, read, write, and transform data from other entities of system 100. In some embodiments, the storage logic 104 can be a computing device configured to make a portion or all of the storage space available on storage devices 110. The storage logic 104 is coupled to the storage devices 110 via signal line 126 for communication and cooperation with the storage devices 110$a$-110$n$ of the system 110. In other embodiments, the storage logic 104 transmits data between the storage devices 110$a$-110$n$ via the signal lines 126$a$-126$n$. It should be recognized that multiple storage logic units 104 can be utilized, either in a distributed architecture or otherwise. For the purpose of this application, the system configuration and operations performed by the system 100 are described in the context of a single storage logic 104.

The storage devices 110$a$, 110$b$ through 110$n$, include one or more non-transitory computer-usable (e.g., readable, writeable, etc.) media, which is any non-transitory apparatus or device that can contain, store, communicate, propagate or transport instructions, data, computer programs, software, code routines, etc., for processing by or in connection with a processor. In some embodiments, the storage devices 110$a$, 110$b$ through 110$n$ communicate and cooperate with the storage logic 104 via signal lines 126$a$, 126$b$ through 126$n$. While the present disclosure describes the storage devices 110 as flash memory devices, it should be understood that in some embodiments, the storage devices 110 may include other non-volatile memory devices, such as hard disk drives and other suitable storage devices. In some embodiments, the storage devices 110$a$-110$n$ may be separate storage apparatuses and may locate separately from each other.

Figure 2:
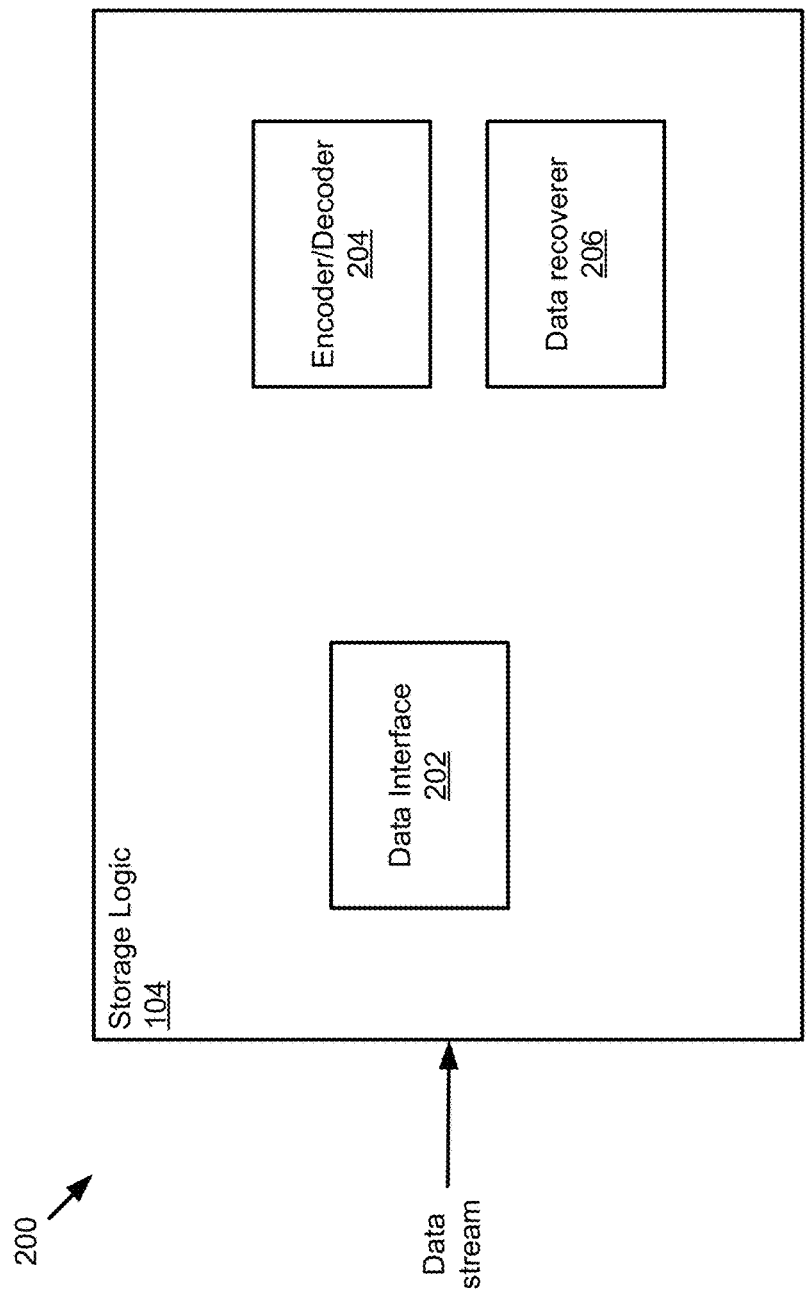
FIG. 2 is a block diagram illustrating an example of storage logic.

FIG. 2 is a block diagram illustrating an example of storage logic 104 according to the techniques described herein. The storage logic 104 includes software and/or hardware logic, such as combinational logic, firmware, software, code, or routines or some combination thereof. The storage logic 104 is executable to computing the recovery-optimal parity code for data storable in storage devices 110. As depicted in FIG. 2, the storage logic 104 may include a data interface 202, an encoder/decoder 204, and a data recoverer 206, which may be electronically communicatively coupled by a communication bus (not shown) for cooperation and communication with each other. These components 202, 204, and 206 are also coupled for communication with other entities (e.g., storage devices 110) of the system 100 via signal lines 126. However, the present disclosure is not limited to this configuration and a variety of different system environments and configurations can be deployed and are within the scope of the present disclosure. Other embodiments may include additional or fewer components.

In some embodiments, the data interface 202, the encoder/decoder 204, and the data recoverer 206 are hardware for performing the operations described below. In some embodiments, the data interface 202, the encoder/decoder 204, and the data recoverer 206 are sets of instructions executable by a processor or logic included in one or more customized processors, to provide its respective functionalities. In some embodiments, the data interface 202, the encoder/decoder 204, and the data recoverer 206 are stored in a storage apparatus and are accessible and executable by a processor to provide its respective functionalities. In further embodiments, the data interface 202, the encoder/decoder 204, and the data recoverer 206 are adapted for cooperation and communication with a processor and other components of the system 100.

The data interface 202 comprises logic executable to send and/or receive/retrieve data and/or commands from one or more devices. In one embodiment, the data interface 202 receives a data stream (data packets) from one or more devices and prepares them for storage in a non-volatile storage device (e.g., storage devices 110). In some embodiments, the data interface 202 receives incoming data packets and temporally stores the data packets into a memory buffer (which may or may not be part of the storage logic 104). In some embodiments, the data interface 202 receives data stored in storage device(s) 110, and/or storages data in the storage device(s) 110.

The data interface 202 receives incoming data and/or retrieves data from one or more data stores such as, but not limited to, storage devices 110 of the system 100. Incoming data may include, but is not limited to, a data stream, data set, and/or a command. The data stream may include a set of data blocks/elements (e.g., current data blocks of a new data stream, existing data blocks from storage, etc.). The set of data blocks/elements (e.g. of the data stream) can be associated with but are not limited to, documents, files, e-mails, messages, blogs, and/or any applications executed and rendered by a customized processor and/or stored in memory.

The data encoder/decoder 204 is logic for encoding data (sets of elements) to be stored on a plurality of data content stores 110 to generate parity code. The data encoder/decoder 204 may be electronically communicatively coupled by a communication bus (not shown) for cooperation and communication with other components of the storage logic 104. In some embodiments, the data encoder/decoder 204 is a processer. The data encoder/decoder 204 may receive sets of data blocks/elements from the data interface 202. In some embodiments, the data encoder/decoder 204 may generate parity code for data to be stored on the data content stores 110 in the system 100. The data encoder/decoder 204 may generate two parities (first and second parities, such as horizontal and skipper parities discussed herein) of the content stored to the storage devices 110. The operations of generating data parity performed by the data encoder/decoder 204 are described in detail below with reference to FIGS. 3A-7B.

The data recoverer 206 is logic for recovering data from a failed content store from full or partial of the data elements of the remaining data content stores using the parity code. For the purpose of differentiation, the content stores that are not failed are called the remaining data content stores throughout the present disclosure. The data recoverer 206 may be electronically communicatively coupled by a communication bus (not shown) for cooperation and communication with other components of the storage logic 104. In some embodiments, the data recoverer 206 is a processor. The data recoverer 206 may retrieve parity code from the data encoder/decoder 204 or from a content store that the parity code stores in. Although depicted as distinct elements in the example of FIG. 2, the data recoverer 206 may include the data encoder/decoder 204 or the other way around. In some embodiments, the data recoverer 206 may perform the functions of the data encoder/decoder 204. The operations of recovering data from the data elements of the remaining data content stores using the parity code performed by the data recoverer 206 are described in detail below with reference to FIGS. 8-12.

Figure 3A:
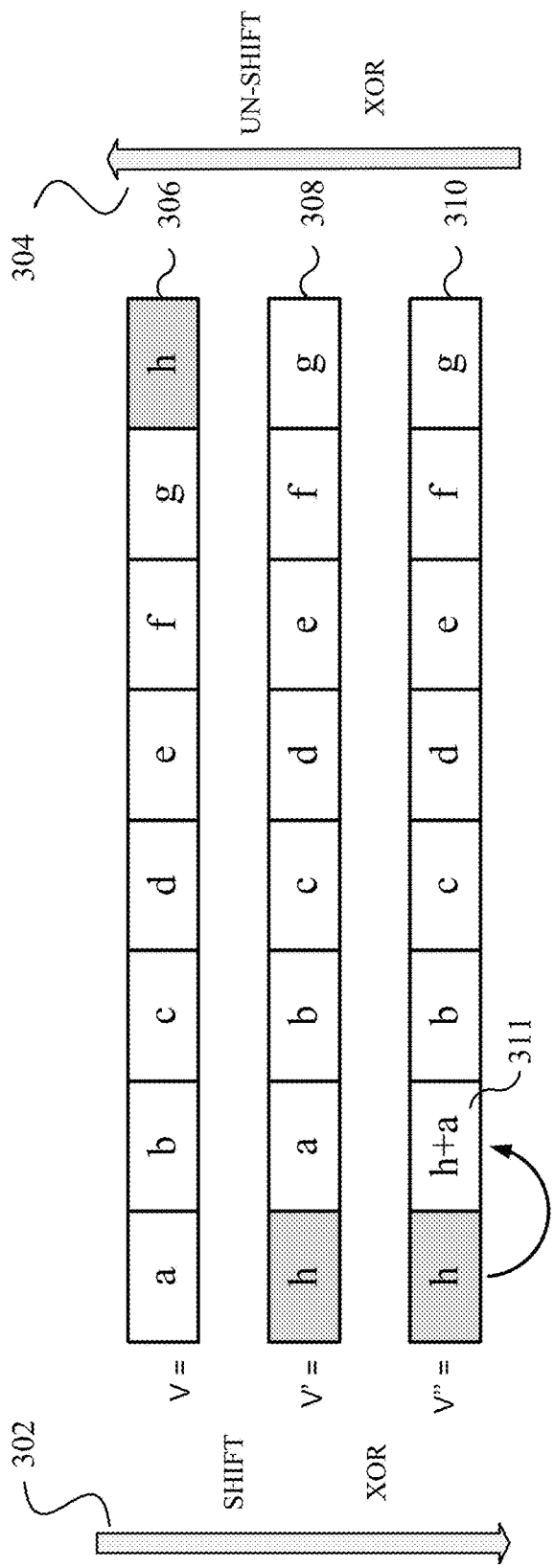
FIG. 3A is a graphical representation illustrating an example process of generating a skipper parity using invertible operations.

FIG. 3A is a graphical representation illustrating an example process 302 of generating a skipper parity using invertible (e.g., bitwise) operations. The example data element 306, which represents a data vector V, includes a plurality of data blocks (in this case eight (8) bits) of data, although it should be understood that the data blocks may include two or more data blocks, and the blocks may include bits, collections of bits, or other suitable data types, all of which may be applicable.

In the illustrated embodiment, the blocks are represented as a, b, c, d, e, f, g, h, etc. The data encoder/decoder 204 may transform the blocks of the data element 306 using a invertible operation (a shift operation) into shifted data blocks forming a shifted data element 308, which represents a data vector V'. In this example, the transformation shifts the blocks of the data element 306 so the right-most block "h" is shifted to the position of the left-most block, and the other blocks move one block to the right, although it should be understood that other shifting sequences and/or directions are also possible and contemplated.

Next, the data encoder/decoder 204 may transform one or more of the blocks of the shifted data element 308 to form the skipper parity data element 310 which represents a data vector V". The transformation may be performed using a mathematical operation, such as an invertible operation, which in this case is an XOR (exclusive or) operation. More particularly, in this example, the second block 311 from the left end of the skipper parity data element 310 is constructed by combining the left-most block, which is "h", and the second block from the left end, which is "a", of the shifted data element 308. The result is the shifted, XOR'd (shift-XOR) "h+a" data block 311.

The data encoder/decoder 204, or another suitable component such as the data recoverer 206, may perform a reconstruction process 304 to reconstruct the original data element 306 and/or blocks thereof, in which case inverted/reverse corresponding bitwise operations are performed (XOR (to cancel out h and restore a) and un-shift (to place the bits in their original positions reflected in data element 306). By performing the reverse/inverted process 304, the system 100 may recreate one or more blocks of the data element 306.

Figure 3B:
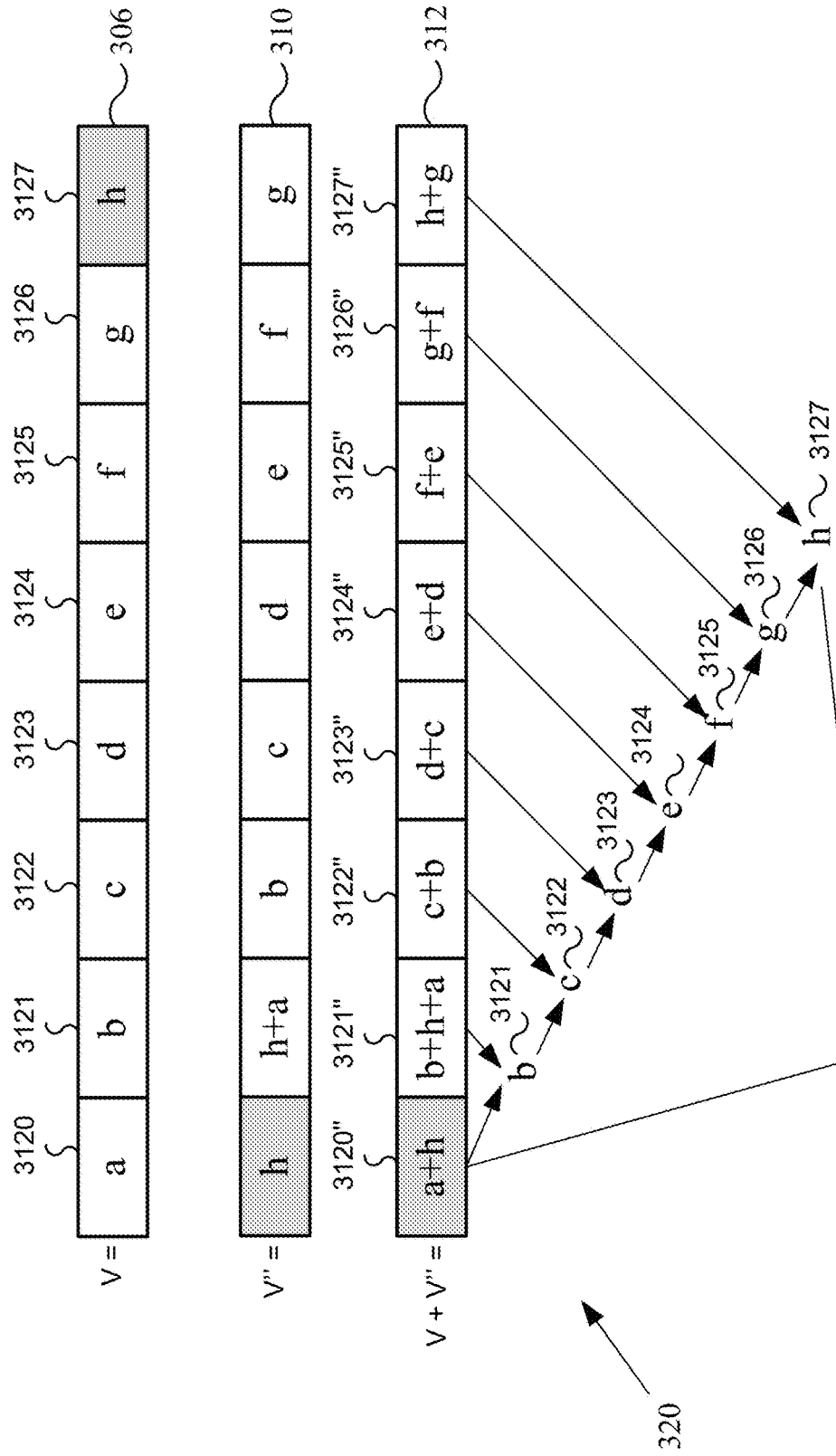
FIG. 3B is a graphical representation illustrating an example skipper parity recovery operation.

FIG. 3B is a graphical representation illustrating an example skipper parity recovery operation 320. As depicted in FIG. 3B, the skipper parity data element 310 may be constructed using the process 302 described with respect to FIG. 3A. The data encoder/decoder 204 may perform a sum operation on the data element 306 (V) and the skipper parity data element 310 (V") to form a recovery parity data element 312 (V+V"). More particularly, the corresponding blocks of the data elements 306 and 310 are XOR'd to form the value shown in the corresponding block of the recovery parity data element 312 (V"). For instance, block 3120 and 3120' are combined to form 3120", and so forth for the other blocks 3121"-3127".

In some embodiments, the data recoverer 206, or another component, such as encoder/decoder 204, may recover the data element 306, or one or more blocks thereof, from the blocks of skipper parity data element 312. As depicted in FIG. 3B, the recovery parity data element 312 includes a plurality of blocks (e.g., eight (8) bits in this example, which are the blocks 3120", 3121", 3122", 3123", 3124", 3125", 3126", 3127").

The recovery operation 320 may recover block(s) of the data element 306 by summing blocks of the data element 312 that precede, with respect to an XOR direction, the position of the block being recovered. The summation results in canceling redundant blocks and yielding the recovered block. More particularly, in this case, the XOR direction begins at the first element and extends in the same direction as the shift direction (to the right).

As a further example, to recover block 3121, block 3120" is XOR'd with block 3121," in which case a+h cancels out, and b is the result, which reflects the original block 3121. To recover block 3122, blocks 3120" and 3121" are XOR'd, and the result of that operation is then XOR'd with 3122", in which case a+h cancels out leaving b, and b cancels out leaving c, which reflects the original block 3122. These cyclic operations are repeated further to recover blocks 3123-3127. To recover block 3120, blocks 3120" and 3121" are XOR'd, and the result is XOR'd with 3122", and so on and so forth until all the blocks have been cyclically XOR'd, and then the result, which is h in this case, is XOR'd with block 3120" to arrive at a, which reflects original column 3120.

FIG. 4A is a diagram illustrating the generation of an example horizontal parity 406 and an example skipper parity 408 for two example content stores 402 and 404. Content store 402 (also called A) includes two data elements, A0 and A1. Content store 404 (also called B) also includes two data elements, B0 and B1.

As shown, the content stores A and B are used to generate a horizontal parity 406 and a skipper parity 408. A skipper parity can be a parity having or generated using a skipper parity data element. The data encoder/decoder 204 may encode the horizontal parity 406 by taking the XOR of A0 and B0 to form the first row 4060 and taking the XOR of A1 and B1 to form the second row 4061.

For the skipper parity 408, the data encoder/decoder 204 may encode it by taking the XOR of A1 and B0 to form the first row 4080. For the second row 4081, which includes a skipper parity data element 4082, the data encoder/decoder 204 may generate the skipper parity data element 4082 by transforming A0 using the process 302 discussed with reference to FIG. 3A, and may then take the XOR of skipper parity data element 4082 and B1.

FIGS. 4B and 4C is a diagram further the generation of an example horizontal parity 456 and an example skipper parity 458 for two example content stores 452 and 454. Content store 452 includes two data elements, 450 and 451. Content store 454 also includes two data elements, 440 and 441.

As shown, the content stores 452 and 454 are used to generate a horizontal parity 456 and a skipper parity 458. The data encoder/decoder 204 may encode the horizontal parity 456 by taking the XOR of data elements 450 (a, b, c, d) and 440 (a, b, c, d) to form the first row 460 (a a, b b, c c, d d) and taking the XOR of data elements 451 (e, f, g, h) and 441 (e, f, g, h) to form the second row 461 (e e, f, f, g g, h h).

For the skipper parity 458, the data encoder/decoder 204 may encode it by taking the XOR of data elements 451 (e, f, g, h) and 440 (a, b, c, d) to form the first row 480 (e a, f b, g c, h d). For the second row 481, the data encoder/decoder 204 may generate the skipper parity data element 482 using the process 302 described with reference to FIG. 3A, which is further depicted in FIG. 4C. As shown by FIG. 4C, the data encoder/decoder 204 may retrieve the data vector 450 (a, b, c, d) in 420, and perform a shift operation on it in 422 to form the data vector (d, a, b, c). Next, the data encoder/decoder 204 may modify the second element of the shifted data vector in 424 with the value of the XOR of the first two elements to form the data vector (d, d a, b, c). Then, to form the second row 481, the data encoder/decoder 204 may take the XOR of the skipper parity data vector 482 (d, d a, b, c) and data element 441 (e, f, g, h).

Figure 5:
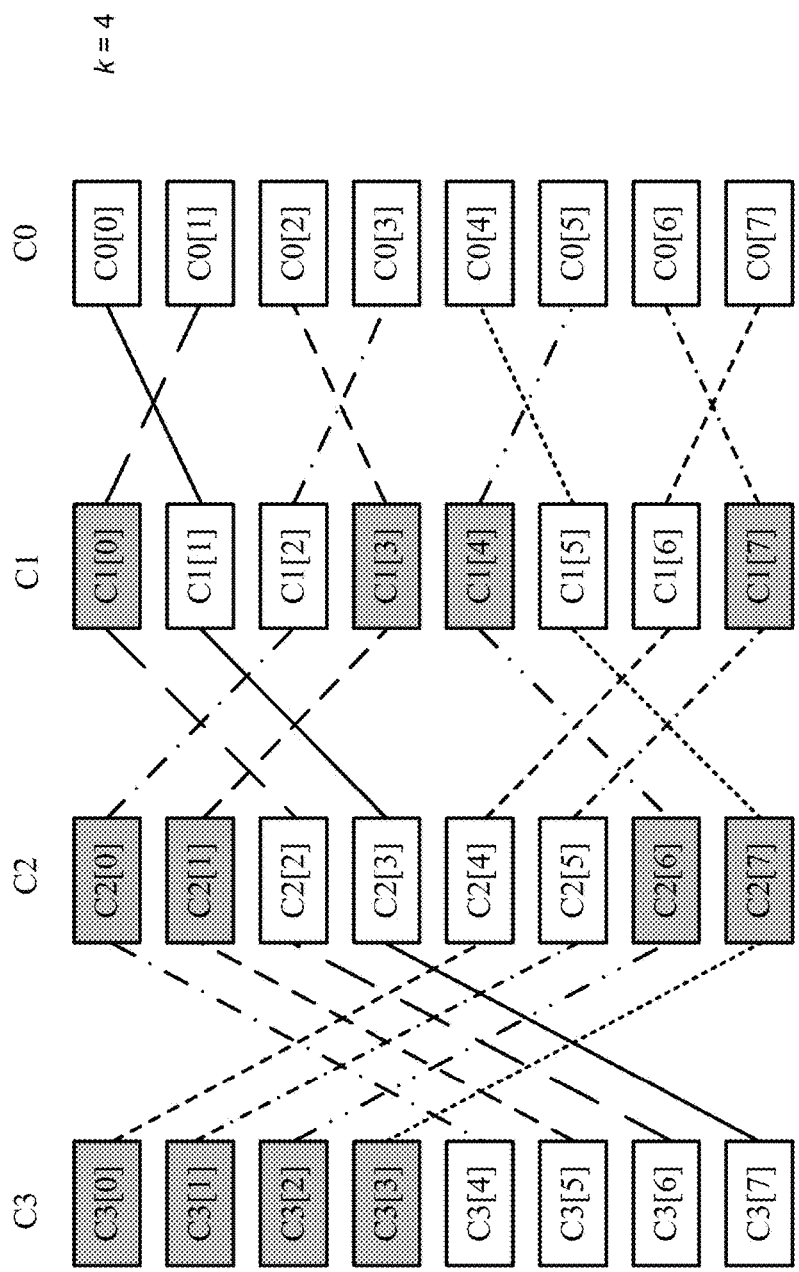
FIG. 5 is a block is a graphical representation illustrating an example skipper parity.

FIG. 5 is a block is a graphical representation illustrating an example skipper parity for four content stores (C0, C1, C2, and C3). In general, fork content stores, the number of elements in each content store is $2^{k-1}$. In the example construction shown in FIG. 5, each of the four content stores contains eight (8) data elements. The data element in column i and row j is denoted as Ci[j]. To be more specific, the data elements along the vertical direction are considered as in a column, the data elements along the horizontal direction are considered as in a row, and the data elements connected by solid lines are considered as sequential, beginning from the element C0[j].

In FIG. 5, the skipper parity data elements are shaded. The shaded elements in FIG. 5 are those Ci[j], for which the ith bit in the binary representation of j is equal to i–1th bit. In the example of FIG. 5, where in the case of C1[3], the binary representation of j is 011 (i.e., j=3). Continuing with the example of C1[3], where i=1, the ith bit is the 1st bit and the i–1th bit is the 0th bit. In the binary representation 011, the 0th bit is 1, the 1st bit is 1 and the 2nd bit is 0. Thus, since the ith bit is equal to the i–1th bit (i.e., the 1st bit and the 0th bit are both 1), therefore this element is shaded. As depicted in FIG. 5, where in the case of C2[j], i=2 and the ith bit is the 2nd bit and the i–1th bit is the 1st bit, the binary representations of j=0, 1, 2, 3, 4, 5, 6, and 7 are 000, 001, 010, 011, 100, 101, 110, and 111, respectively. The elements with the 2nd bit being equal to the 1st bit are shaded. Therefore, the elements C2[0], C2[1], C2[6], and C2[7] are shaded.

Figure 6:
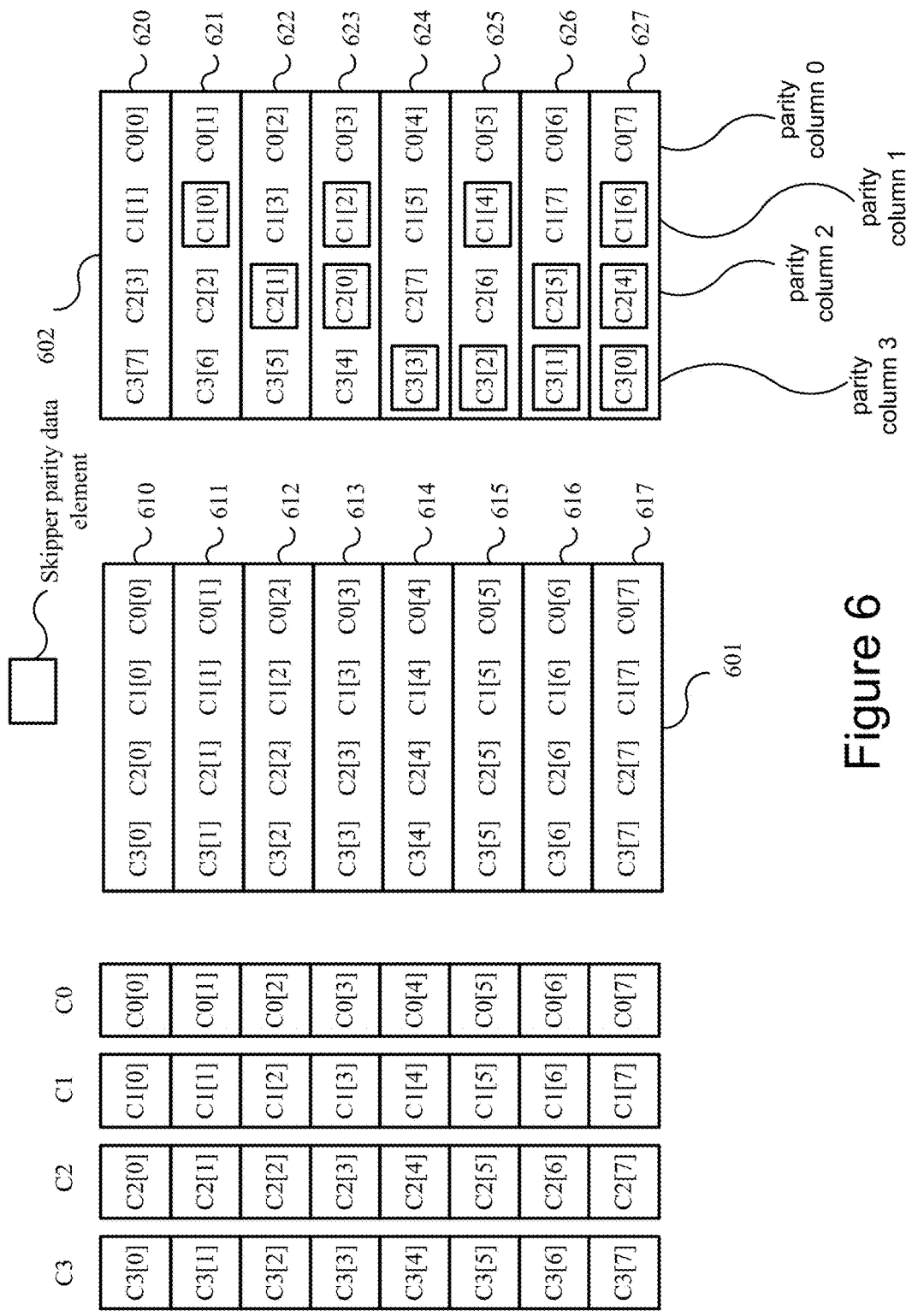
FIG. 6 is an example graphical representation of example content stores and corresponding parities.

FIG. 6 is an example graphical representation of example content stores and corresponding parities. In the depicted example, four content stores (C0, C1, C2, and C3), a horizontal parity 601 and a skipper parity 602 are shown. As discussed above with reference to FIG. 5, a row extends along the horizontal direction, and a column extends along the vertical direction. The horizontal parity 601 may be generated by combining the data elements of the same row from the content stores, as discussed elsewhere herein.

Each of the data elements in the skipper parity 602 that are bounded by a frame are denoted as skipper parity data elements and may be generated using the process 302 discussed elsewhere herein. As discussed above with respect to FIG. 5, the sequencing of the data elements in the rows 620-627) of the skipper parity 602, as well as determining which elements are to be transformed into skipper parity data elements, may be determined using a Fourier transform network, such as a butterfly graph.

As a further example, row 620 of the skipper parity 602 may be encoded using the line originating from C0[0] in FIG. 5, which includes the data elements of C0[0], C1[1], C2[3], and C3[7]. Row 621 of the skipper parity 602, may be encoded using the line originating from C0[1], which includes the data elements of C0[1], C1[0], C2[2], and C3[6], and so on and so forth.

In an even further example, assuming the right-most column of the skipper parity 602 is called parity column zero (0), and the second column from the right end of the skipper parity 602 is called parity column one (1), and so forth, for the parity column x, the data elements in that column are replaced by the skipper parity form of those data elements following manner: skip $2^{x-1}$ data element(s), shiftxor $2^{x-1}$ data elements, then skip $2^{x-1}$ data element(s), shiftxor $2^{x-1}$ data elements until all the data elements have been processed.

For example, in the case of parity column 1, where x=1 so the $2^{x-1}=1$, one data element in the parity column 1 starting from the first data element C1[1] is skipped and the one data element following it is replaced by the skipper parity form. Then another one of the data elements is skipped and another one of the data elements is replace by the skipper parity form.

In another example of parity column 2, where x=2 so the $2^{x-1}=2$. As depicted in the illustrated embodiment with reference to FIG. 6, two data elements starting from the first data element C2[3] are skipped and the two data elements next are replaced by the skipper parity form. Then another two of the data elements are skipped and another two of the data elements are replace by the skipper parity form. For the parity column 0, since x=0, there is no data element being replace by the skipper parity form. By performing the above described operations, the data elements for the skipper parity 602 are ready for combining (e.g., XOR operations).

Unlike other existing solutions, since, in the illustrated embodiment, each data elements from the content only appears once in each of the horizontal and skipper parities, this advantageously allows that, when there is an update to one data element in the content, it only requires a single update to each of the horizontal and skipper parities, thus resulting in a more efficient, optimal update.

Figure 7A:
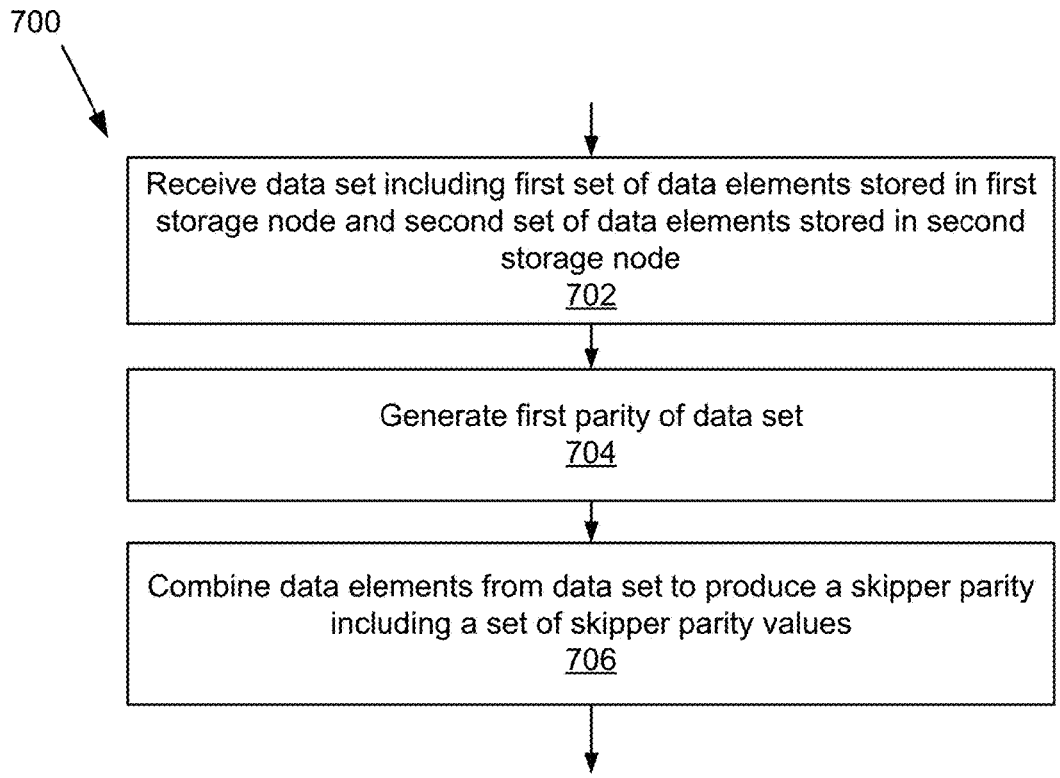
FIG. 7A is a flow chart of an example method for generating a skipper parity.

FIG. 7A is a flow chart of an example method 700 for generating a skipper parity. In block 702, the data interface 202 can receive a data set comprising data elements including a first set of data elements stored in a first storage node and a second set of data elements stored in a second storage node. In block 704, the data encoder/decoder 204 generate a first parity of the data set. The first parity may include a horizontal parity including a set of horizontal parity entries, or another suitable parity. In block 706, the data encoder/decoder 204 may combine the data elements from the data set to produce a skipper parity. The skipper parity may include a set of skipper parity entries. To combine the data elements, the data encoder/decoder 204 may transform a subset of the data elements from the data set using an invertible operation. The set of horizontal parity entries are different in composition from the set of skipper parity entries.

In some embodiments, the data interface 202 may receive the data set of data elements as a data stream from another computing system or devices, such as one coupled to via a computer network and/or communications bus. The storage logic 104 may process the data elements for storage in one or more storage nodes (storage devices 110), and in doing so, may generate horizontal and skipper parities in association therewith. In association with generating the parities, the storage logic 104 may store the content (set of data elements), and the horizontal parity 601 and the skipper parity 602, in various storage nodes (storage devices 110).

In some embodiments, the data may be stored by the data interface 202 across separate storage devices 110, so that, should one or more of the devices fail, the data can be restored as discussed elsewhere herein. In some instances, the parities (e.g., horizontal, skipper, etc.) may be stored in a different storage apparatus (storage device 110, such as a memory, high reliability storage medium, etc.) than the data witch which they are associated, so that the data restoration process can be maintained if needed.

Figure 7B:
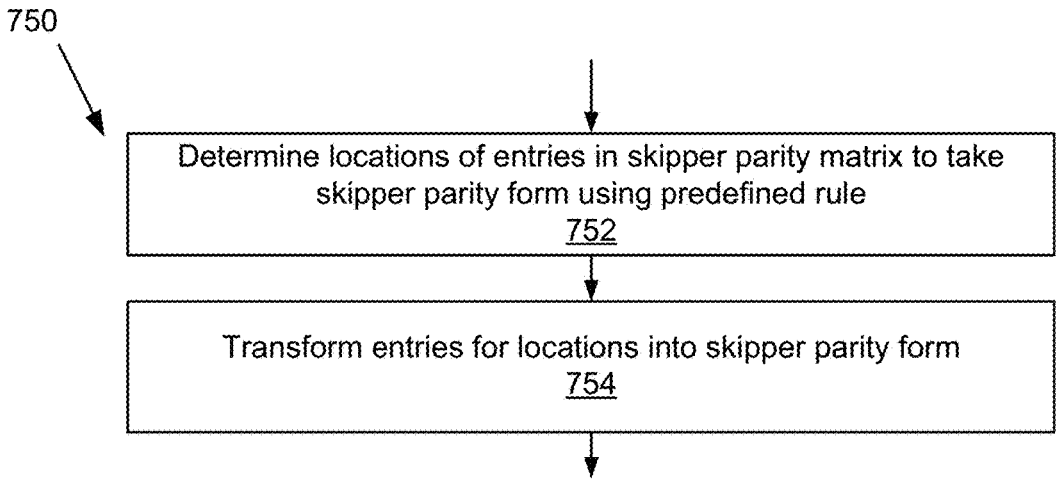
FIG. 7B is a flowchart of an example method for determining parity entries.

FIG. 7B is a flowchart of an example method 750 for determining parity entries. In block, 752, the data encoder/decoder 204 can determine which entries of a skipper parity, which may be embodied by a matrix (called in some cases a skipper parity matrix) should take a skipper parity form (be transformed into skipper parity data elements as discussed elsewhere herein). The locations of the entries in the matrix being transformed to have a skipper parity form may be determined based on a predetermined rule. In some cases, the rule may order the entries of the matrix using a Fourier transform, butterfly graph, or other suitable higher order mathematical transformation.

In block 754, responsive to determining which entries of the skipper parity matrix to transform, the data encoder/decoder 204, or another suitable component, can transform the determined entries into skipper parity entries. In some embodiments, the construction of the skipper parity matrix, including determination of the locations of the data elements and generation of the skipper parity data elements, may be performed as described elsewhere herein, such as with reference to FIGS. 3A-6.

Figure 8:
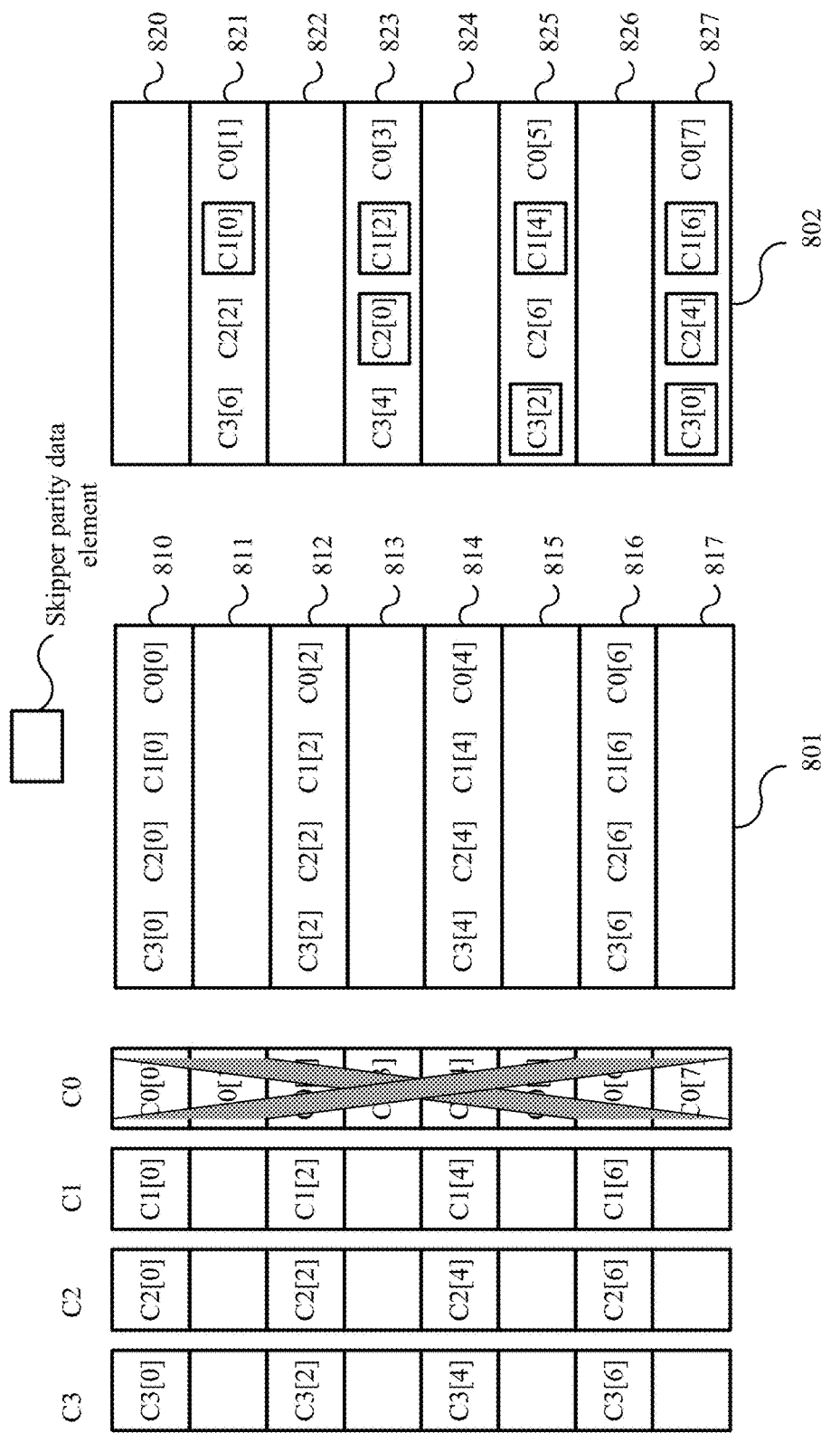
FIG. 8 is a diagram illustrating an example data recovery process for a content store failure.

FIG. 8 is a diagram illustrating an example data recovery process for a content store failure. As depicted in FIG. 8, the first content store C0 failed and data elements C0[0] to C0[7] are unretrievable. The data recoverer 206 may retrieve half of the data elements from the other three remaining data content stores C1, C2, and C3 (which are referred to in this example as the remaining content stores). In this example, the retrieved data elements are the evenly numbered elements. Using the retrieved elements, the data recoverer 206 may retrieve the even rows of the horizontal parity 801 (e.g., 810, 812, 814, and 816) and the odd rows of the skipper parity 802 (e.g., data elements 821, 823, 825, and 827).

Using the available parity entries and data elements, the data recoverer 206 can recover the inaccessible data of the data content store C0 by performing the restoration operations discussed elsewhere herein. For example, using the horizontal parity entries 810 (C0[0] C1[0] C2[0] C3[0]), and the available data elements C1[0], C2[0], and C3[0] from the data content stores C1, C2, and C3, the data recoverer 206 may recover C0[0] by performing inverted mathematical operations (e.g., XOR), as discussed elsewhere herein, to cancel out the three available data elements C1[0], C2[0], and C3[0]. With similar operations, the data recoverer 206 may recovery the data elements C0[2], C0[4], and C0[6] as well.

Further, the data recoverer 206 can recover C0[1] using the skipper parity entries from row 821 (C0[1], skipper parity C1[0], C2[2], and C3[6]) and the available data elements C1[0], C2[2], and C3[6] from the data content stores C1, C2, and C3. The data recoverer 206 may calculate C0[1] by performing inverted mathematical operations (e.g., XOR, unshift), as discussed elsewhere herein, such as with reference to FIGS. 3A-6. With similar operations, the data recoverer 206 may recover the rest of the data elements C0[3], C0[5], and C0[7].

It should be understood that the entries of the horizontal parity 801 and the skipper parity 802 are shown in a generalized form to ease understanding and avoid obfuscation. However, it should be recognized that the entries of the horizontal parity 801 and the skipper parity 802 may be combined, and each may be comprised of an array of data blocks.

Figure 9:
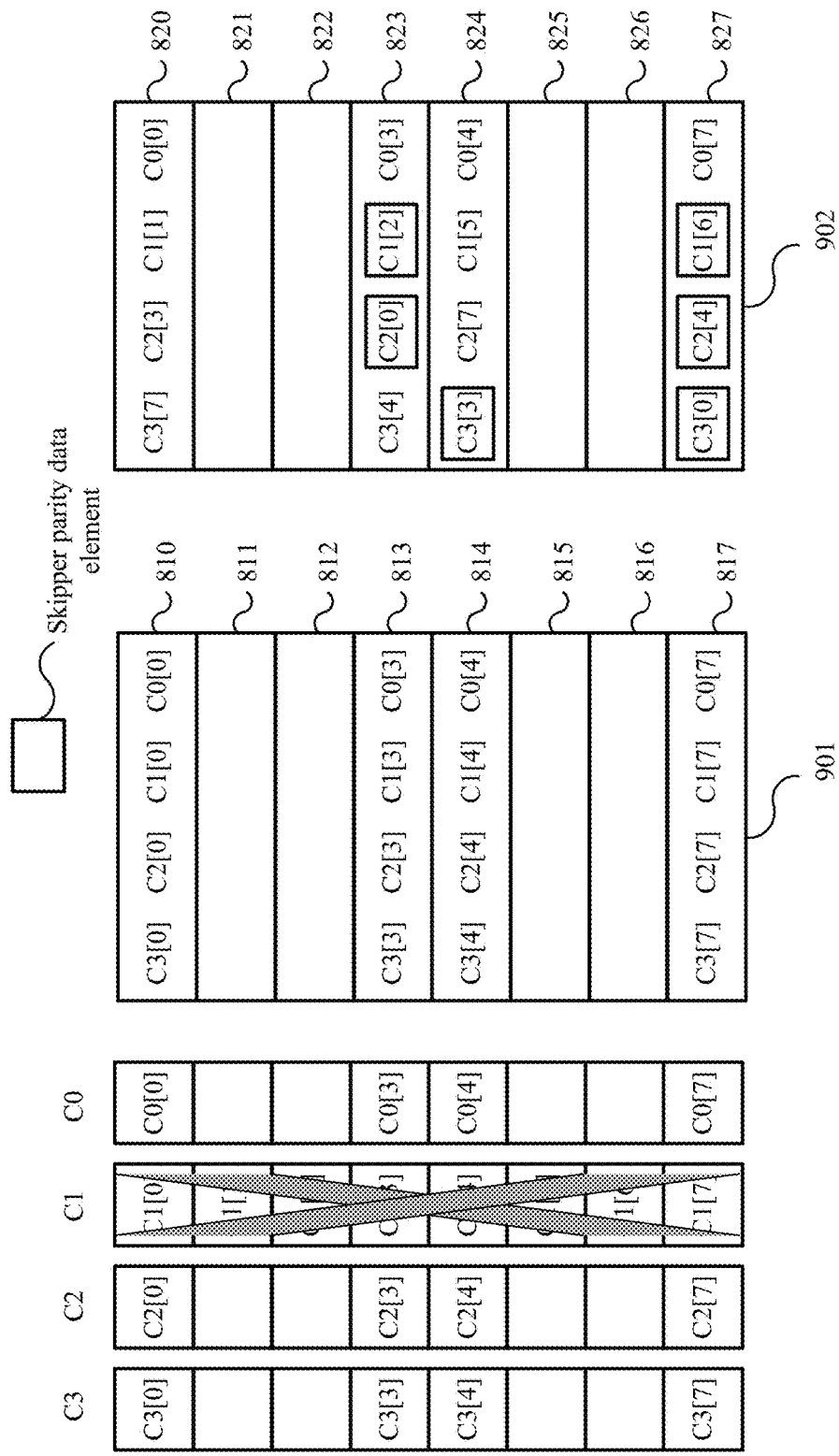
FIG. 9 is a diagram illustrating further example data recovery processes for a content store failure.

FIG. 9 is a diagram illustrating further example data recovery processes for a content store failure. The data recovery processes described with reference to FIG. 9 is similar to that described with reference to FIG. 8, so not all aspects will be repeated here for the purpose of brevity. In the example depicted in FIG. 9, instead of content store C0 failing, C1 has failed and data elements C1[0] till C1[7] are inaccessible. However, the data recoverer 206 can restore the inaccessible data elements using the available data elements, the horizontal parity 901, and the skipper parity 902.

For example, the data recoverer 206 may retrieve the elements of the horizontal parity row 810 elements (C0[0] C1[0] C2[0] C3[0]), and the available data elements C0[0], C2[0], and C3[0] from the data content stores C0, C2, and C3. Using these, the data recoverer 206 may recover C1[0] by performing corresponding inverted mathematical operation(s), as discussed elsewhere herein (e.g., XOR) (which cancels out data elements C0[0], C2[0], and C3[0], and leaves C1[0]). With similar operations, the data recoverer 206 may recover the data elements C1[3], C1[4], and C1[7] as well.

For C1[1], the data recoverer 206 can recover it using the skipper parity entries from row 820 (C0[0], C1[1], C2[3], and C3[7]). Since this row 820 does not include a skipper parity data element (no elements are framed using a box), C1[1] can be calculated using the available data elements C0[0], C2[3], and C3[7] by performing corresponding inverted mathematical operation(s) (e.g., XOR) similar to those used for the horizontal parity 901 above.

Further, the data recoverer 206 can recover C1[2] using the skipper parity entries from row 823 (C0[3], skipper parity C1[2], skipper parity C2[0], and C3[4]) and the available data elements C0[3], C2[0], and C3[4] from the data content stores C0, C2, and C3 by corresponding performing inverted mathematical operation(s) (e.g., XOR, unshift), as discussed elsewhere herein, such as with reference to FIGS. 3A-6. With similar operations, the data recoverer 206 may recover the rest of the data elements C1[5] and C1[6].

Analogous operations to those discussed with reference to FIGS. 8 and 9 can be used to restore the data elements of content stores C2 and C3 should they experience a failure.

Figure 10:
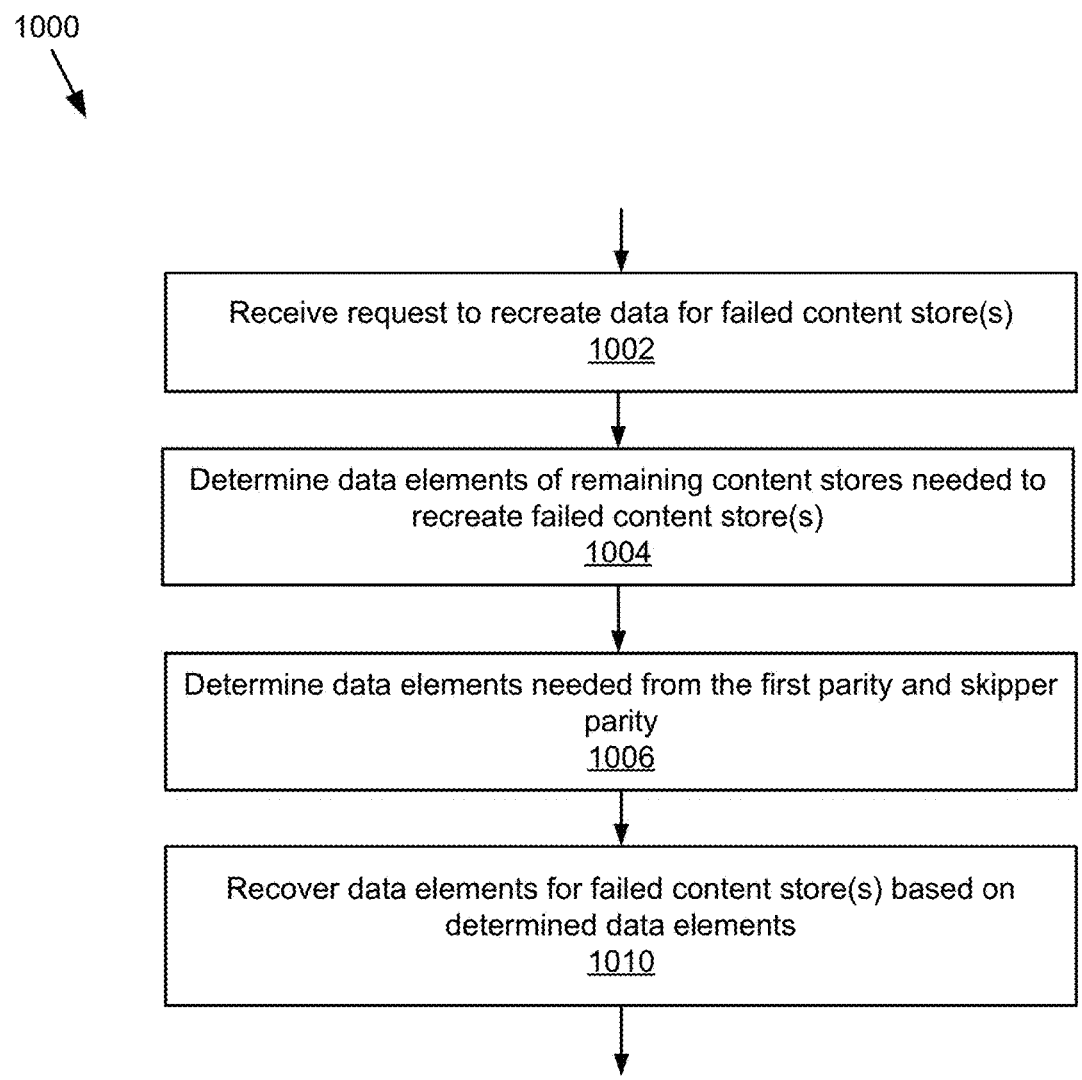
FIG. 10 is a flowchart of an example method for recreating data for failed content store(s).

FIG. 10 is a flowchart of an example method 1000 for recreating data for failed content store(s). The method 1000 may begin by receiving 1002 a request to recreate data for a failed subset of content stores (e.g., one or more) of a plurality of content stores. In some embodiments, the data recoverer 206 receives the request to recreate data for one or more failed content stores. For clarity, the content stores that have not failed are called the available content stores. In some embodiments, the request to recreate data may include information for identifying the failed content store(s) (e.g., content store ID, etc.). In some embodiments, the operation performed in block 1002 may be performed by data recoverer 206 the data interface 202 and/or one or more other components of the system 100.

Next, the method 1000 may determine 1004 the data elements from the available content stores needed to recreate the inaccessible data elements (in combination with the horizontal and skipper parities), based on which data elements are inaccessible. The method 1000 may continue by determining 1006 the data elements needed from the first/horizontal parity and the skipper parity. In some embodiments, the data recoverer 206 may determine the needed data elements of the horizontal parity and the skipper parity based on which content store(s) have failed, as discussed elsewhere herein. In some embodiments, the operation performed in block 1006 may be performed by data recoverer 206 and/or one or more other components of the system 100.

Next, the method 1000 may continue by recovering 1010 the data elements for the failed content store(s) based on the determined data elements from the available content stores and the horizontal parity and the skipper parity, using the recovery operations/processes discussed elsewhere herein. In some embodiments, the operation(s) performed in block 1010 may be performed by data recoverer 206 and/or one or more other components of the system 100.

Figure 11:
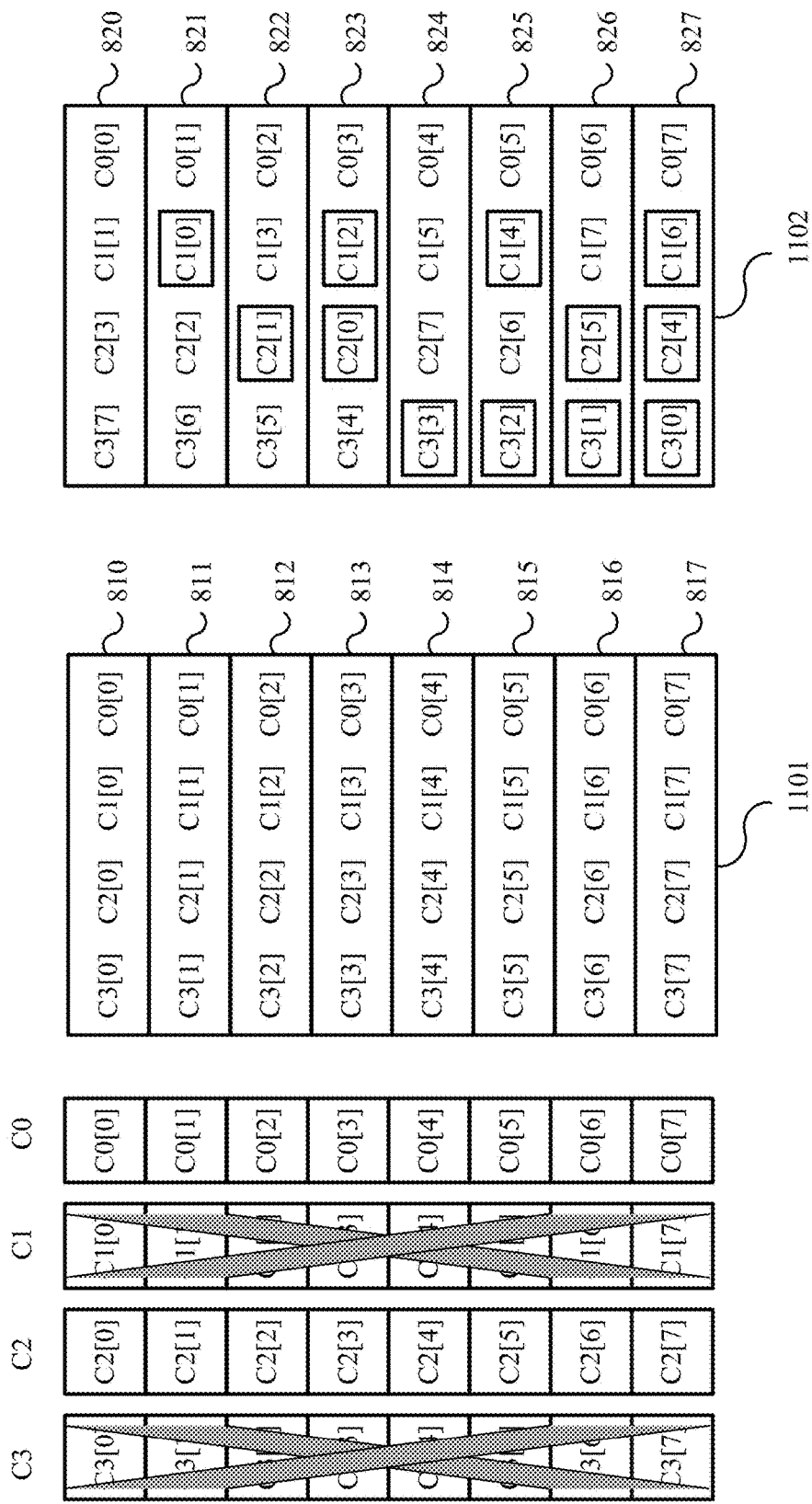
FIG. 11 is a diagram illustrating an example data recovery process for two content store failures.

FIG. 11 is a diagram illustrating an example data recovery process for two content store failures. As depicted in FIG. 11, the content stores C1 and C3 failed and the data elements C1[0] through C1[7] and C3 [0] through C3 [7] are unretrievable/inaccessible. As discussed elsewhere herein, the horizontal parity 1101 and the skipper parity 1102 may have been constructed when the data was stored in the content stores. The horizontal parity 1101 and the skipper parity 1102 may be stored in a separate storage device 110, such as a high-reliability storage medium so they are available for recreating the data content upon failure of a content store. The horizontal and skipper parities 1101 and 1102 can be retrieved by the data recoverer 206 to restore the inaccessible data elements.

Figure 12:
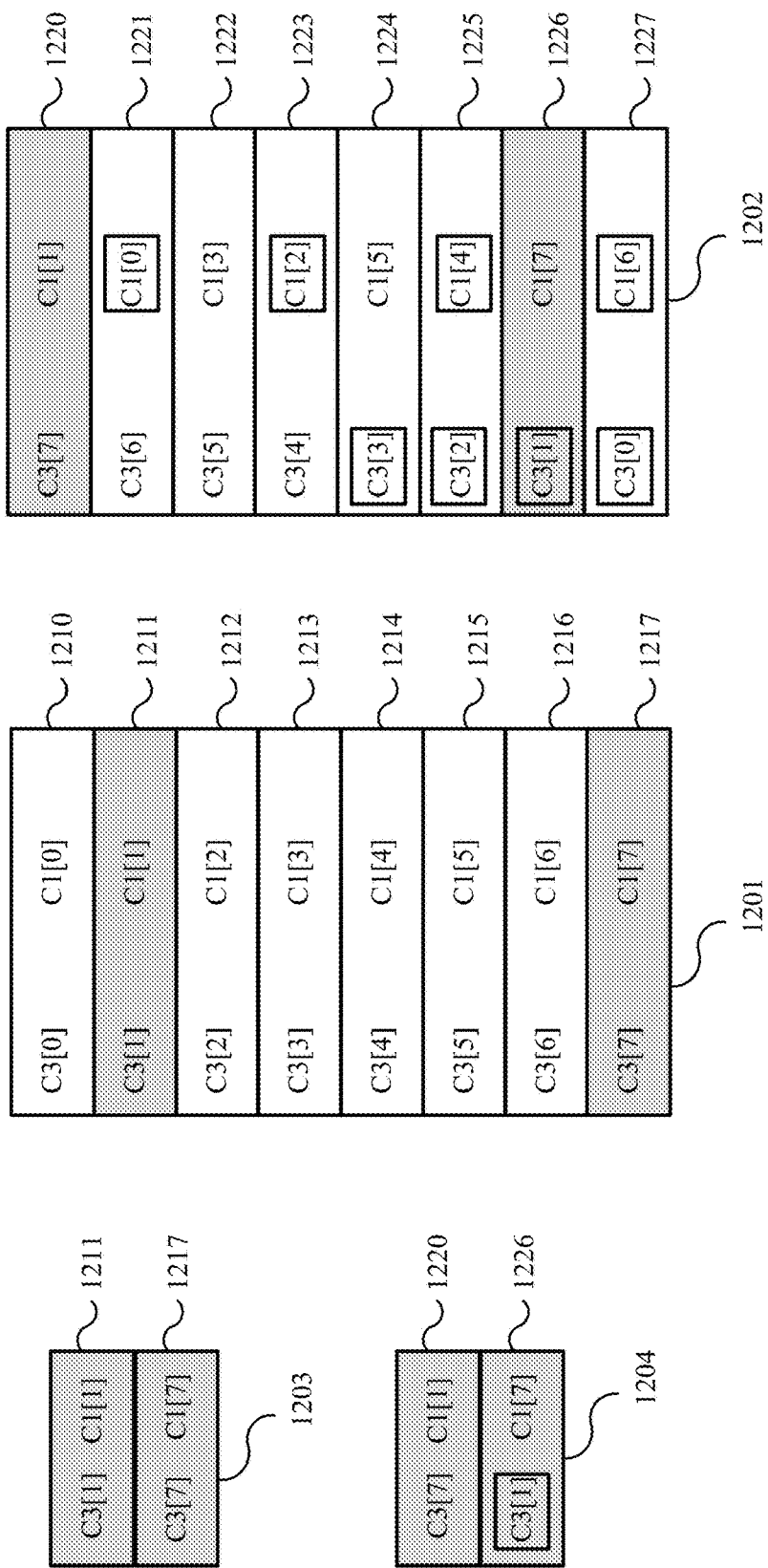
FIGS. 12 and 13 illustrate how inaccessible data elements may be restored using a horizontal and skipper parity.
Figure 13:
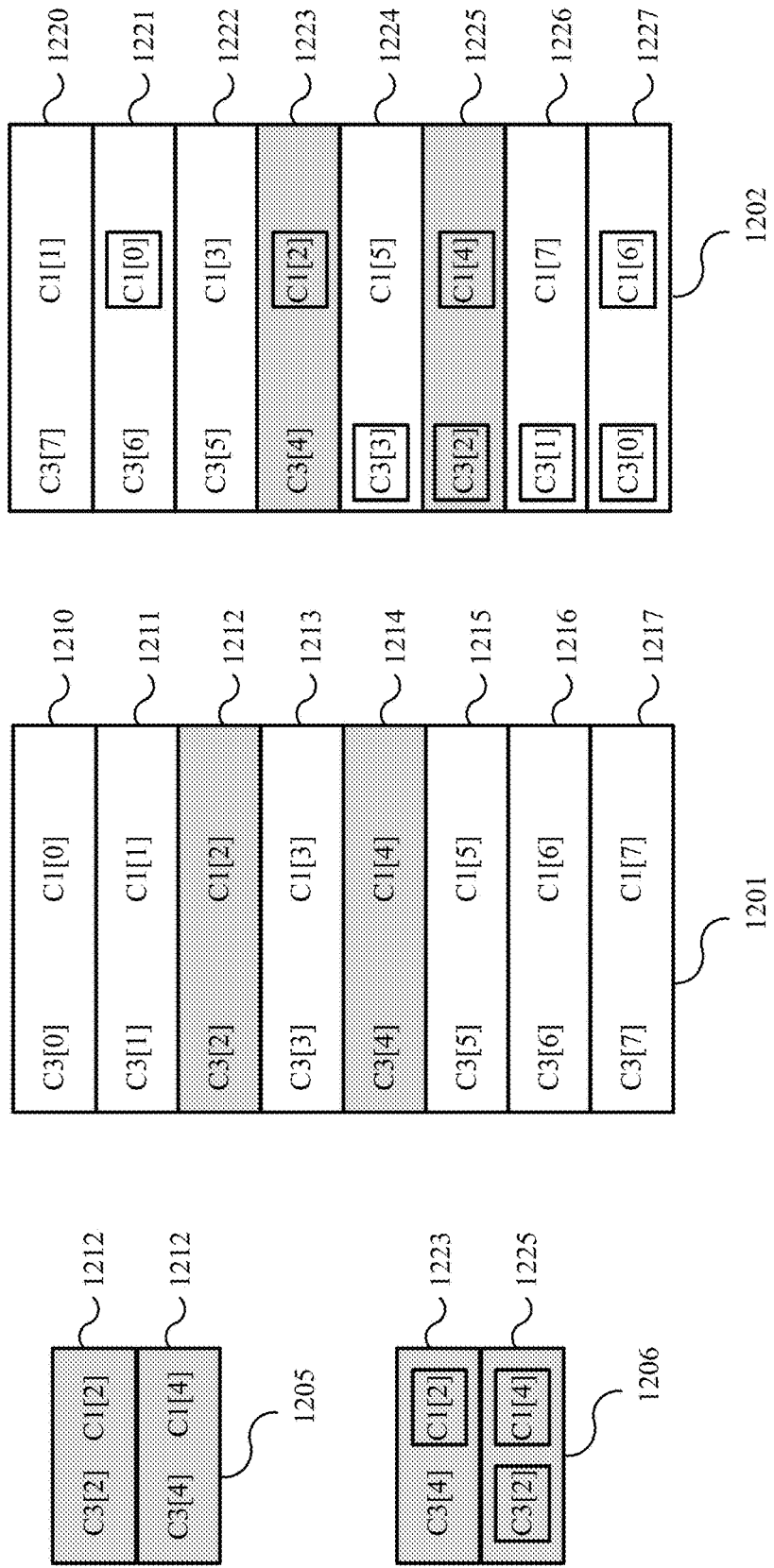

The inaccessible data elements may be restored as shown in FIGS. 12 and 13. In particular, the horizontal parity 1201 may be generated by data recoverer 206 to include the available data elements from content stores content stores C0 and C2. The skipper parity 1202 may be generated by data recoverer 206 by including the data elements from the inaccessible content stores C1 and C3 (e.g., from the skipper parity 1102).

The data recoverer 206 may obtain entries from rows 1220 and 1226 of the skipper parity 1202, as discussed above with reference to FIGS. 3A and 3B. For example, the first row 1220 includes data elements C1[1] and C3[7]. The next data elements that are needed are from row 1226, which includes data element C1[7] and skipper parity data element C3[1]. Next, the data recoverer 206 may obtain entries from rows 1211 and 1217 of the horizontal parity 1201, where the row 1211 includes C1[1] and C3[1], and the row 1217 includes C1[7] and C3[7]. The data recoverer 206 may use the entries of rows 1211, 1217, 1220, and 1226, to calculate the original data elements. For example, the data recoverer 206 may process the entries from rows 1211, 1217, 1220, and 1226 as follows:

C3[1]C1[1] ⊕C3[7]C1[7] ⊕C3[7]C1[1] ⊕ C3[1] C1[7] =C3[1] C3[1]

Using the above equation, the resulting data has the form of V+V'''. Therefore, the original data elements C1[1], C1[7], C3[1], and C3[7] may be recovered using the cyclic operations discussed with reference to FIGS. 3A and 3B.

As depicted in FIG. 13, the data recoverer 206 may obtain entries from rows 1223 and 1225 of the skipper parity 1202, and entries from the rows 1212 and 1214 of the horizontal parity 1201. The data recoverer 206 may use the entries from rows 1212, 1214, 1223, and 1225 to calculate the original data elements. For example, the data recoverer 206 may process the entries as follows:

$\boxed{C3[2]}\boxed{C1[2]} \oplus C3[4]C1[4] \quad \oplus C3[4]\boxed{C1[2]} \oplus \boxed{C3[2]}\boxed{C1[4]} = C1[4]$ $\boxed{C1[4]}$ Using the above equation, the resulting data is the form of V+V". Therefore, the original data elements C1[4], C3[4], C1[2], and C3[2] may be recovered using the cyclic operations discussed with reference to FIGS. 3A and 3B.

Figure 14:
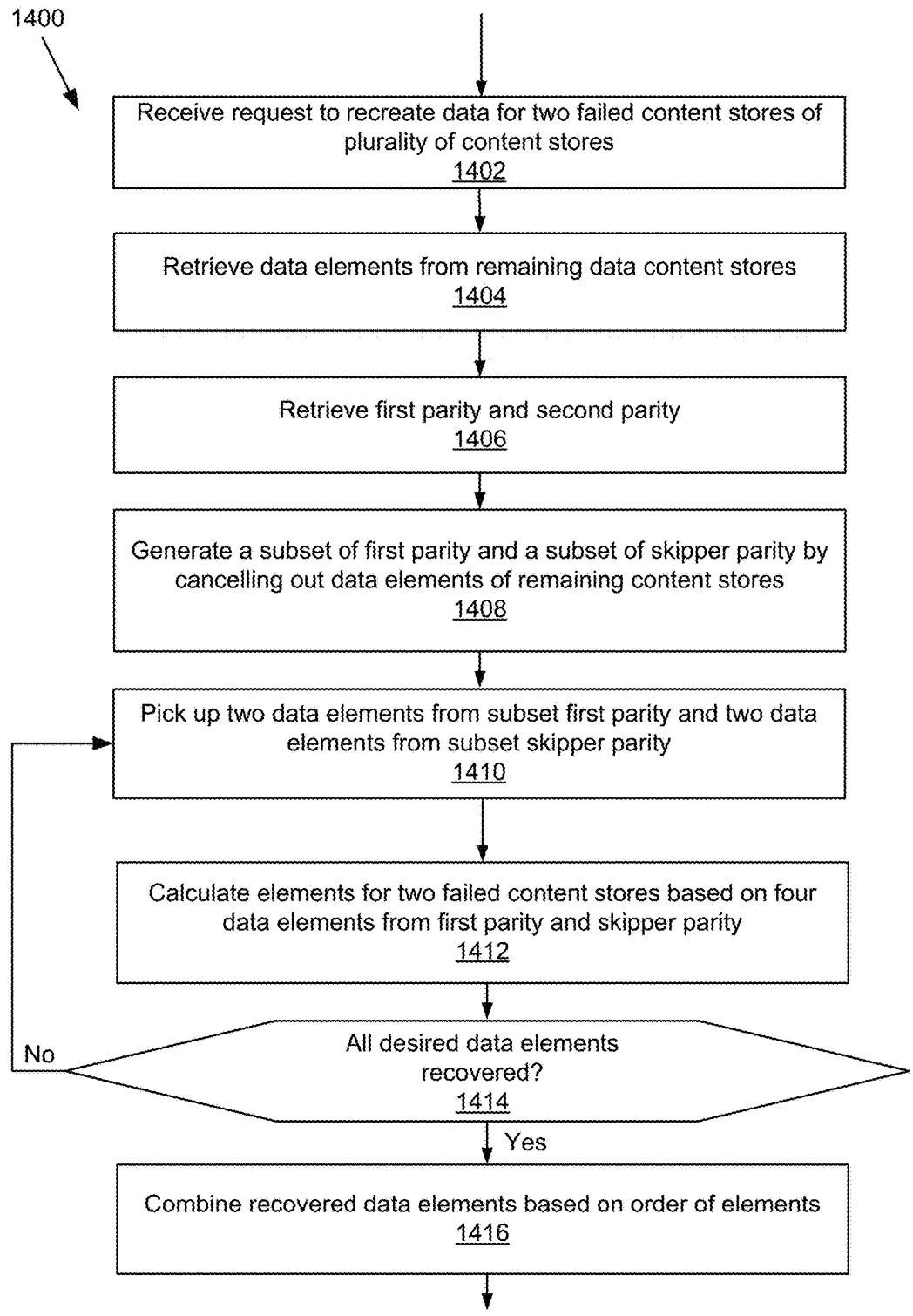
FIG. 14 is a flowchart of an example method for recreating data for two failed content stores.

FIG. 14 is a flowchart of an example method 1400 of recreating data for two failed content stores from a plurality of content stores. The method 1400 may begin by receiving 1402 a request to recreate data for two failed content stores of a plurality of content stores. In some embodiments, the data recoverer 206 receives the request to recreate data for two failed content stores, which may be identified in the request (e.g., using unique storage node identifiers). In some embodiments, the operation(s) performed in block 1402 may be performed by data recoverer 206 and/or the data interface 202 and/or one or more other components of the system 100.

Next, the method 1400 may retrieve 1404 data elements from the available data content stores. In some embodiments, the data recoverer 206 may retrieve the data elements from the available data content stores. In some embodiments, the operation(s) performed in block 1404 may be performed by data recoverer 206 and/or one or more other components of the system 100.

Next, the method 1400 may retrieve 1406 the horizontal parity 1101 and the skipper parity 1102. In some embodiments, the data recoverer 206 may retrieve horizontal parity 1101 and the skipper parity 1102. In some embodiments, the operation(s) performed in block 1406 may be performed by data recoverer 206 and/or one or more other components of the system 100.

Next, the method 1400 may generate 1408 the horizontal parity 1201, which may reflect a subset of the horizontal parity 1101, and the skipper parity 1202, which may reflect a subset of the skipper parity 1102. In some embodiments, the data recoverer 206 may generate the subset horizontal parity 1201 and the subset skipper parity 1202 by cancelling out the data elements of the available data content stores from the horizontal parity 1101 and the skipper parity 1102, respectively. In some embodiments, the operation(s) performed in block 1408 may be performed by data recoverer 206 and/or one or more other components of the system 100.

Next, the method 1400 may continue by obtaining 1410 two data elements from the horizontal parity 1201 and two data elements from the skipper parity 1202. In some embodiments, the data recoverer 206 may pick up two data elements from the horizontal parity 1201 and two data elements from the skipper parity 1202. In some embodiments, the operation(s) performed in block 1410 may be performed by data recoverer 206 and/or one or more other components of the system 100.

Next, the method 1400 may advance by calculating 1412 the data elements for the two failed content stores based on the four data elements from the horizontal parity 1201 and the skipper parity 1202. In some embodiments, the data recoverer 206 may calculate 1412 the data elements for the two failed content stores based on the four data elements from the horizontal parity 1201 and the skipper parity 1202. The detailed calculation is discussed with reference to FIGS. 12 and 13. In some embodiments, the operation(s) performed in block 1412 may be performed by data recoverer 206 and/or one or more other components of the system 100.

Next, the method 1400 may process by determining 1414 whether all the data elements for the two failed content stores have recovered. In some embodiments, the data recoverer 206 determines whether all the data elements for the two failed content stores have recovered. If the result of the determination is NO, then the method 1400 goes back to block 1410. If the result of the determination is YES, the method 1400 may process by combining 1416 the recovered data elements based on the order of the elements. In some embodiments, the data recoverer 206 may combine the recovered data elements based on the order of the elements. In some embodiments, the operations performed in block 1414 and 1416 may be performed by data recoverer 206 and/or one or more other components of the system 100.

Systems and methods for implementing a dynamically sized reverse map in a storage device are described below. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to user interfaces and particular hardware. Moreover, the technologies disclosed above primarily in the context of on line services; however, the disclosed technologies apply to other data sources and other data types (e.g., collections of other resources for example images, audio, web pages).

Reference in the specification to "one embodiment", "some embodiments" or "an embodiment" means that a particular feature, structure, or characteristic described in connection with the embodiment is included in at least one embodiment of the disclosed technologies. The appearances of the phrase "in one embodiment" in various places in the specification are not necessarily all referring to the same embodiment.

Some portions of the detailed descriptions above were presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer.

The disclosed technologies can take the form of an entirely hardware implementation, an entirely software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the processes and displays presented herein may not be inherently related to any particular computer or other apparatus. Various general-purpose systems may be used with programs in accordance with the teachings herein, or it may prove convenient to construct a more specialized apparatus to perform the required method operations. The required structure for a variety of these systems will appear from the description below. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A data storage system comprising:
a plurality of storage nodes including a first storage node and a second storage node; and
memory storing storage logic that is coupled to the plurality of storage nodes and that manages storage of data on the plurality of storage nodes, the storage logic executable by a hardware processor to:
  receive a data set including a plurality of data elements associated with the plurality of storage nodes, the data set including:
    a first set of data elements associated with the first storage node; and
    a second set of data elements associated with the second storage node;
  generate a horizontal parity including a set of horizontal parity entries that correspond to row combinations of the plurality of data elements associated with the plurality of storage nodes;
  store the horizontal parity on a third storage node, the third storage node being different from the plurality of storage nodes;
  generate a skipper parity including a set of skipper parity entries by transforming a subset of the data elements from the data set using an invertible operation, the set of horizontal parity entries being different from the set of skipper parity entries;
  store the skipper parity on the third storage node; and
  responsive to determining a failure of the first storage node, recreating data elements of the first storage node using a portion of data elements associated with storage nodes of the plurality of storage nodes that have not failed in combination with the horizontal parity and the skipper parity.

2. The data storage system of claim 1, wherein the invertible operation includes one of a shift operation and an exclusive-or (XOR) operation.

3. The data storage system of claim 1, wherein the storage logic is further executable to:
receive a request to recreate the first set of data elements using the horizontal parity and the skipper parity.

4. The data storage system of claim 3, wherein the first storage node is a failed storage node.

5. The data storage system of claim 3, wherein the storage logic is further executable to:
in response to receiving the request to recreate the first set of data elements, retrieve the second set of data elements, the horizontal parity, and the skipper parity; and
recreate the first set of data elements based on the second set of data elements, the horizontal parity, and the skipper parity.

6. The data storage system of claim 3, wherein the storage logic is further executable to:
in response to receiving the request to recreate the first set of data elements, determine needed data elements of the second storage node to recreate data for the first set of data elements, the needed data elements comprising a subset of the second set of data elements;
determine needed horizontal parity entries of the horizontal parity and needed skipper parity entries of the skipper parity; and
recreate the first set of data elements based on the needed data elements of the second storage node and the determined parity entries.

7. The data storage system of claim 6, wherein the needed data elements of the second storage node include at least half and less than all of the second set of data elements.

8. The data storage system of claim 1, wherein to combine the data elements from the data set to produce the skipper parity includes determining locations of certain skipper parity data elements in a skipper parity matrix using a predefined rule.

9. A computer-implemented method comprising:
receiving a data set comprising a plurality of data elements associated with a plurality of storage nodes, the data set including a first set of data elements associated with a first storage node of the plurality of storage nodes and a second set of data elements associated with a second storage node of the plurality of storage nodes;
generating a horizontal parity of the data set, the horizontal parity including a set of horizontal parity entries;
store the horizontal parity in a third storage node, the third storage node being different from the plurality of storage nodes;
generate a skipper parity including a set of skipper parity entries, by transforming a subset of the data elements from the data set using an invertible operation, the set of horizontal parity entries being different from the set of skipper parity entries;
store the skipper parity in the third storage node; and
responsive to determining a failure of the first storage node, recreate data elements of the first storage node using a portion of data elements associated with storage nodes of the plurality of storage nodes that have not failed in combination with the horizontal parity and the skipper parity.

10. The computer-implemented method of claim 9, wherein the invertible operation includes one of a shift operation and an exclusive-or (XOR) operation.

11. The computer-implemented method of claim 9, further comprising receiving a request to recreate the first set of data elements using the horizontal parity and the skipper parity.

12. The computer-implemented method of claim 11, wherein the first storage node is a failed storage node.

13. The computer-implemented method of claim 11, further comprising:
in response to receiving the request to recreate the first set of data elements, retrieving the second set of data elements, the horizontal parity, and the skipper parity; and
recreating the first set of data elements based on the second set of data elements, the horizontal parity, and the skipper parity.

14. The computer-implemented method of claim 11, further comprising:
in response to receiving the request to recreate the first set of data elements, determining needed data elements of the second storage node to recreate data for the first set of data elements, the needed data elements comprising a subset of the second set of data elements;
determining needed horizontal parity entries of the horizontal parity and needed skipper parity entries of the skipper parity; and
recreating the first set of data elements based on the needed data elements of the second storage node and the determined parity entries.

15. The computer-implemented method of claim 14, wherein the needed data elements of the second storage node include at least half and less than all of the second set of data elements.

16. The computer-implemented method of claim 9, wherein combining the data elements from the data set to produce the skipper parity includes determining locations of certain skipper parity data elements in a skipper parity matrix using a predefined rule.

17. A system comprising:
means for receiving a data set comprising a plurality of data elements associated with a plurality of storage nodes, the data set including a first set of data elements associated with a first storage node of the plurality of storage nodes and a second set of data elements associated with a second storage node of the plurality of storage nodes;
means for generating a horizontal parity of the data set, the horizontal parity including a set of horizontal parity entries;
means for storing the horizontal parity in a third storage node, the third storage node being different from the plurality of storage nodes;
means for generating a skipper parity including a set of skipper parity entries generated by transforming a subset of the data elements from the data set using an invertible operation, the set of horizontal parity entries being different from the set of skipper parity entries.

18. The system of claim 17, wherein the invertible operation includes one of a shift operation and an exclusive-or (XOR) operation.

19. The system of claim 17, wherein the first storage node is a failed storage node.

20. The system of claim 17, wherein combining the data elements from the data set to produce the skipper parity includes determining locations of certain skipper parity data elements in a skipper parity matrix using a predefined rule.

* * * * *